United States Patent [19]
Naruse

[11] Patent Number: 5,508,064
[45] Date of Patent: Apr. 16, 1996

[54] METHOD FOR MATTING A RECORDING MATERIAL AND ATOMIZING DEVICE THEREFOR

[75] Inventor: Yasuhito Naruse, Shizuoka, Japan

[73] Assignee: Fuji Photo Films Co., Ltd., Minami-Ashigara, Japan

[21] Appl. No.: 168,127

[22] Filed: Dec. 17, 1993

[30] Foreign Application Priority Data

Dec. 17, 1992 [JP] Japan ..................... 4-354769

[51] Int. Cl.$^6$ ..................... B05D 1/02
[52] U.S. Cl. ............ 427/421; 427/475; 427/484; 427/485; 427/486; 239/700
[58] Field of Search ............. 427/475, 484, 427/485, 486, 421; 239/700, 701, 702, 703, 704, 705, 706, 707, 708

[56] References Cited

U.S. PATENT DOCUMENTS

| 4,106,697 | 8/1978 | Sickles et al. | 239/15 |
| 4,132,357 | 1/1979 | Blackington | 427/377 |
| 4,512,518 | 4/1985 | Inukai et al. | 239/223 |
| 4,589,597 | 5/1986 | Robisch et al. | 239/703 |
| 4,597,533 | 7/1986 | Shirai et al. | 239/701 |
| 4,626,484 | 12/1986 | Nishioka et al. | 430/273 |
| 4,781,941 | 11/1988 | Inukai et al. | 427/421 |
| 4,842,982 | 6/1989 | Seibel et al. | 430/156 |

FOREIGN PATENT DOCUMENTS

| 0379373 | 7/1990 | European Pat. Off. . |
| 1360193 | 3/1964 | France . |
| 43-28403 | 12/1943 | Japan . |
| 51-98505 | 8/1976 | Japan . |
| 51-96604 | 8/1976 | Japan . |
| 51-111102 | 10/1976 | Japan . |
| 55-12974 | 1/1980 | Japan . |
| 55-101951 | 8/1980 | Japan . |
| 57-34558 | 2/1982 | Japan . |
| 58-104656 | 6/1983 | Japan . |
| 59-65763 | 5/1984 | Japan . |
| 61-48994 | 10/1986 | Japan . |
| WO85/01455 | 4/1911 | WIPO . |

Primary Examiner—Shrive Beck
Assistant Examiner—David M. Maiorana
Attorney, Agent, or Firm—Burns, Doane, Swecker & Mathis

[57] ABSTRACT

A method for matting a recording medium comprises supplying a humidifying gas stream onto the outer periphery of an atomized stream of fine droplets of an aqueous solution containing a matting agent by atomizing device along the atomized stream for affixing the fine droplets on the recording material, drying the liquid material in a drying chamber for forming micro-projections of the matting agent. Convex-shaped micro-projections of the matting agent, strongly affixed on the recording medium, are formed without contaminating the working environment.

6 Claims, 5 Drawing Sheets

METHOD FOR MATTING A RECORDING MATERIAL AND ATOMIZING DEVICE THEREFOR

This invention relates to a method for matting the obverse surface and/or the reverse surface of a recording material.

BACKGROUND

There have been known a variety of techniques concerning manufacture of a recording material, one of them being a technique of matting the obverse and/or reverse surfaces of a photosensitive material for preventing static charges from accumulating on the material and preventing neighboring photosensitive material portions from adhering to one another and for improving vacuum adhesion property. As an example, when a photographic original film is superimposed on a photosensitive material during a light exposure step and light exposure is applied through a film of original picture for forming an image on the photosensitive material, it is necessary for the original picture film to be contacted tightly to the surface of the photosensitive layer of the photosensitive material to effect light exposure to preclude blurring of exposed image due to a gap between the surface of the photosensitive layer and the original picture film superposed thereon to obtain a clear image. A conventional practice is to put the photosensitive material and the original picture film between a rubber sheet and a glass plate of a vacuum printing frame and to establish a vacuum between the glass plate of the printing frame and the rubber sheet to bring them into tight contact with each other. This method is referred to as a "vacuum adhesion method". It has also been contemplated and practiced to provide a photosensitive layer for matting the layer for significantly reducing the evacuating time for tight contact as disclosed in JP Patent KOKAI Publication No. 51-111102 (1976). For matting the photosensitive layer, that is for formation of micro-sized patterns on the photosensitive layer, there are known methods described in, e.g., JP Patent KOKAI Publication Nos. 51-96604 (1976), 51-98505 (1976), 55-12974 (1980), etc.

Recently, a so-called double-sided photosensitive material, in which photosensitive layers are provided on both surfaces of its support, has become extensively popular. If attempts are made to use such photographic material to provide a fine pattern on both surfaces of the photosensitive layer by a gravure coating method, as described for example in JP Patent KOKAI Publication No. 51-96604 (1976), it is necessary to apply the fine pattern on one surface and allow it to be dried and subsequently to apply the fine pattern on the opposite surface and allow it to be dried. The device used for this purpose tends to be bulky in size. Besides, the portions of the reverse surface of the photosensitive material coated with the fine pattern tends to be delaminated or crushed by frictional contact with transport rollers during the process. This leads to a prolonged evacuation time for tight contact in case of image exposure on the reverse surface as compared to the case of that on the obverse surface. In addition, the portion of the reverse surface coated with the fine pattern, exposed to light subsequently in the course of the light exposure process, tends to be pressed by a printer during evacuated light exposure of the obverse surface and thereby crushed leading to a protracted evacuation time in the course of light exposure of the reverse surface.

The JP Patent KOKAI Publication No. 51-98505 (1976) shows a method of dispersing a wax-like resin or fine resin powders exhibiting mold release properties in a low boiling point organic solvent and spraying with an air spray for preventing the coating layer intended to improve the vacuum adhesion property from possibly contaminating the photographic original film. However, this coating layer tends to detach due to low adhesive force with respect to the photosensitive photographic film surface to incur the above-mentioned problems, as well. Besides, use of the organic solvents is not desirable from the viewpoint of safety during manufacture.

On the other hand, the JP Patent KOKAI Publication No. 55-12974 (1980) discloses a method of sprinkling solid powders on the presensitized printing plate for thermally affixing the solid powders on the printing plate. This method has a problem in that, if the presensitized printing plate is of the double-sided type, the mat layer on one side tends to be crushed before cooling during roller transport after adhesion by heat fusion. On the other hand, it is difficult from the viewpoint of handling to transport the printing plates without using the rollers. Besides, the resin needs to be pulverized and classified in size for producing the powders to raise manufacture costs.

In addition, the JP Patent KOKAI Publication No. 55-101951 (1980) discloses a method of causing solid powders to be uniformly dispersed and affixed to the surface of a continuously travelling presensitized printing plate. The device used for this purpose tends to be complex and bulky in size because of the provision of a pressurized air supplying device, powder supplying device, ejector, distributor, cyclone, etc., and suffers from a defect that the solid powders tend to detach during transport of the double-sided presensitized printing plate.

For solving the aforementioned problems, the JP Patent KOKAI Publication No. 57-34558 (1982) discloses a method of spraying an aqueous solution containing a resin dissolved or dispersed therein on the surface of the presensitized printing plate having a photosensitive layer on a support thereof and drying the aqueous solution. Although this method gives highly satisfactory mat properties, it has disadvantages as to propriety in manufacturing. That is, if an air spray is used, since it provides an extremely low rate of deposition of fine droplets amounting only to 10%, droplets which have not become deposited contaminate the inside of the coating chamber as overspraying. In an extreme case, the aqueous solution is likely to be affixed to a plate under spray-coating as a lump of wasteful resin. An electro-static spraying system, assuring a deposition rate of approximately 90% or higher, has been devised for diminishing the overspraying.

However, the following problem is met when the aqueous solution is applied by an electrostatic spraying system. First, with the electro-static spraying system, since fine droplets are attached to static charges, those droplets which can not contact strongly with the surface to be spray-coated, such as extremely small-sized or highly viscous droplets which are dried to some extent during a period of time after being atomized before being affixed to the surface to be spray-coated, are affixed to the surface of a recording material in the spherical-shaped states. This provides only a small contact surface and consequently a low binding force. In an extreme case, the droplets remain affixed merely electrostatically to the surface to be spray-coated. The result is that, if the photosensitive material is transported in contact with rollers or the like, the droplets which have been affixed are detached so that the evacuating time for tight contact can not be reduced as in the case of the above-described prior-art method. In addition, the film for the original picture or the transport rollers tend to be contaminated. Besides, with a bell or disc type device, the aqueous solution tends to be dried at the portions of the bell or disc where liquid flow of a thin film is obstructed to allow the resin to be precipitated and/or to interfere with the atomization process. Incidentally, the precipitated resin tends to become affixed to the article to be spray-coated.

For overcoming these problems, there is disclosed in U.S. Pat. No. 4,781,941, which corresponds to JP Patent KOKOKU Publication No. 61-48994 (1986), a method of matting a pre-sensitized printing plate. The method is comprised of electrostatically providing fine droplets of an aqueous liquid with a resin resolved or dispersed therein on the obverse surface and/or reverse surface of the pre-sensitized plate and thereafter, drying the fine droplets. The method is characterized in that before and/or after the attachment of the droplets, the surface of the pre-sensitized plate is wet. On the other hand, the JP Utility Model KOKAI Publication No. 59-65763 (1984) discloses a bell structure for preventing resin precipitation.

However, these methods are disadvantageous in that they necessitate complicated devices which can be produced only with expenditure of immense costs and labor.

If an ink jet system is used, the problem of the droplets being detached at pass rollers or contaminating ambient casing parts may be overcome. However, since oscillating elements, electrodes, etc, are necessitated for each nozzle, the mechanism tends to become complex and expensive to manufacture.

The foregoing description is directed to an example of improving vacuum adhesion property of the photosensitive material by matting the photosensitive material. However, the matting of the photosensitive material is also applied for preventing electro-static charging and self-agglutination or adhesion of the photosensitive materials to one another. Also, not only the obverse surface but also the reverse surface of the photosensitive material is occasionally matted. The same problems as those met when the vacuum adhesion property is to be achieved as described above are met with the matting carried out for these purposes.

SUMMARY OF THE INVENTION

It is an object of the present invention, to provide a method for matting a recording material whereby an atomized stream may be prevented from becoming dried or scattered-away and the resulting matting particles, that is micro-projections of a matting agent, become strongly affixed without becoming planarized or detached during handling of the recording material.

It is another object of the present invention to provide a rotary atomizing device which is simplified and which requires only a small quantity of ancillary equipment.

Still further objects will become apparent from the entire disclosure.

According to the present invention, the above-mentioned objects may be accomplished by the following method for matting the recording material and rotary atomizing device, referred to as the first and second aspects, respectively.

First Aspect

The first aspect relates to a method for matting a recording material by allowing fine droplets of an aqueous liquid containing a matting agent for matting the recording material to be affixed to the recording material and dried for generating micro-projections of the matting agent for matting the recording material, characterized in that a humidifying gas stream is supplied onto an outer periphery of an atomized stream formed by the fine droplets along the direction of the atomized stream.

Second Aspect

According to the second aspect of the invention there is provided a rotary atomizing device comprising a rotary atomizing unit formed by a bell-shaped or cup-shaped rotary body having its large diameter portion as an opening end, with the atomizing unit being rotated about a rotary axis of the rotary body, a driving unit for causing rotation of the rotary atomizing unit, and means such as a port assembly for supplying a humidifying gas stream substantially surrounding said rotary atomizing unit along the direction of an atomized stream produced by said rotary atomizing unit.

It is preferred that the means for supplying a humidifying gas stream comprises:

humidifying gas stream supply port or ports formed retracted from the opening end and opened along the direction of an atomized stream, wherein the humidifying gas supply port or ports are disposed on an annulus centered on the rotary axis and having a diameter not less than the diameter of the opening end.

With the matting method of the present invention, since the humidifying gas stream is supplied to the outer periphery of the atomized stream, not only are the fine droplets constituting the atomized stream prevented from being dried, but also the fine droplets in the atomized gas stream are prevented from radially outward scattering-away to contaminate the surrounding. Also, since the humidifying gas stream is supplied along the direction of, and from the outer peripheral side of, the atomized stream, the travelling speed of the fine droplets in the atomized stream is increased along the direction of the atomized stream. Consequently, when the fine droplets are impinged on the recording material, preferred, convex-shaped mats strongly affixed to the recording material, that is, micro-projections of the matting agent, are formed on the recording material.

With the rotary atomizing device, the humidifying gas stream supply ports are provided at a retracted position from the opening end of the rotary atomizing unit, and are opened along the direction of the atomized stream, the humidifying gas stream can be provided along the direction of the atomized stream. Also, since the humidifying gas stream supply ports are provided on an annulus having its center at the rotary axis of the rotary atomizing unit and having a diameter not less than the diameter of the opening end of the rotary atomizing unit, the humidifying gas stream can be supplied to the outer periphery of the atomized stream released from the opening end.

Consequently, with the rotary atomizing device of the present invention, the fine droplets of the atomized stream are prevented from being dried, while the fine droplets are prevented from being scattered radially outwardly of the device to prevent contamination of the surrounding objects. On the other hand, the fine droplets are increased in the travelling speed along the direction of the atomized stream to permit the fine droplets to be impinged on the recording material.

With the matting method for the recording material of the present invention, since the humidifying gas stream is supplied on an outer periphery of an atomized stream of fine droplets containing a matting agent for matting the recording medium, in the direction of the atomized stream, it becomes possible to prevent the fine droplets of the atomized stream from being dried and to control the scattering-away of the fine droplets as well as to increase the speed at which the fine droplets stream is propelled along the direction of the atomized stream. In this manner, micro-projections of desired, convex-shaped matting agent, affixed to the recording material, may be formed without contaminating the working environment by the scattering around of the fine droplets.

The rotary atomizing device of the present invention comprises a rotary atomizing unit formed of a bell-shaped or cup-shaped rotary body having its large diameter portion as an opening end, wherein the atomizing unit is rotated about the rotary axis of the rotary body. The rotary atomizing device also comprises a driving unit for causing rotation of the rotary atomizing unit, and humidifying gas stream supply ports retracted from the opening end and opened toward the direction of the atomized gas stream. The humidifying gas supply ports are disposed on an annulus being centered on the rotary axis and having a diameter not less than the diameter of the opening end. Thus the humidifying gas stream is supplied onto the outer peripheral side of the atomized gas stream along the direction of the atomized stream. Consequently, the device can be advantageously employed in the matting method for the recording material according to the present invention.

EXPLANATION OF NUMERALS

1 . . . recording material;
2 . . . temperature adjustment chamber;
3 . . . pass roller;
4A, 4B . . . atomizing devices;
5 . . . drying chamber;
6 . . . pass roller;
7 . . . spray booth;
8 . . . gas ejection unit;
9 . . . gas ejection ports;
10A . . . rotary bell;
10B . . . driving unit;
11A, 11B . . . gas ejection slits.

DETAILED DESCRIPTION OF EMBODIMENTS

The fine droplets of an aqueous solution containing a matting agent for matting the recording material may be obtained by atomizing an aqueous solution containing the matting agent in a variety of atomizing devices.

The matting agent may be any of those capable of matting the recording material. Preferably, those resins enumerated hereinbelow may be employed.

The liquid material containing the matting agent may be produced by dissolving or dispersing the matting agent in a solvent.

The humidifying gas stream may preferably be adjusted to a humidity not less than 35% and usually substantially equal to 70%. If the humidity is below 35%, the fine droplets tend to dry during travel and to become attached to the recording material in the spherical state so that the fine droplets tend to detach from the recording material. Conversely, if the humidity exceeds 70%, leakage of electric current tends to be undesirably produced when the atomized stream is electrically charged.

The rotary atomizing device of the present invention is suitable as a means for supplying the humidifying gas stream to the outer peripheral side of and along the atomizing direction of the atomized stream.

The rotary atomizing unit is a bell- or cup-shaped rotary body having its large diameter portion as an opening end and is rotated about the axis of rotation of the rotary body. If an aqueous solution containing the matting agent is supplied to the inner periphery of the small diameter portion of the rotary body, the solution is spread in the form of a film on the inner peripheral surface of the rotary body so as to be discharged as an atomized stream at the opening end of the large diameter portion.

The rotary atomizing unit is preferably rotated at a rate of 8000 to 20,000 rpm. The supply rate of the matting agent contained in the solution may be set to e.g., 5 to 300 cc/min.

A voltage of $-40$ to $-120$ kV may also be supplied to the rotary atomizing unit for electrically charging the atomized stream.

Preferred shapes and dispositions of the humidifying gas supply ports will be explained by referring to FIGS. 2 to 8.

Figure 1:
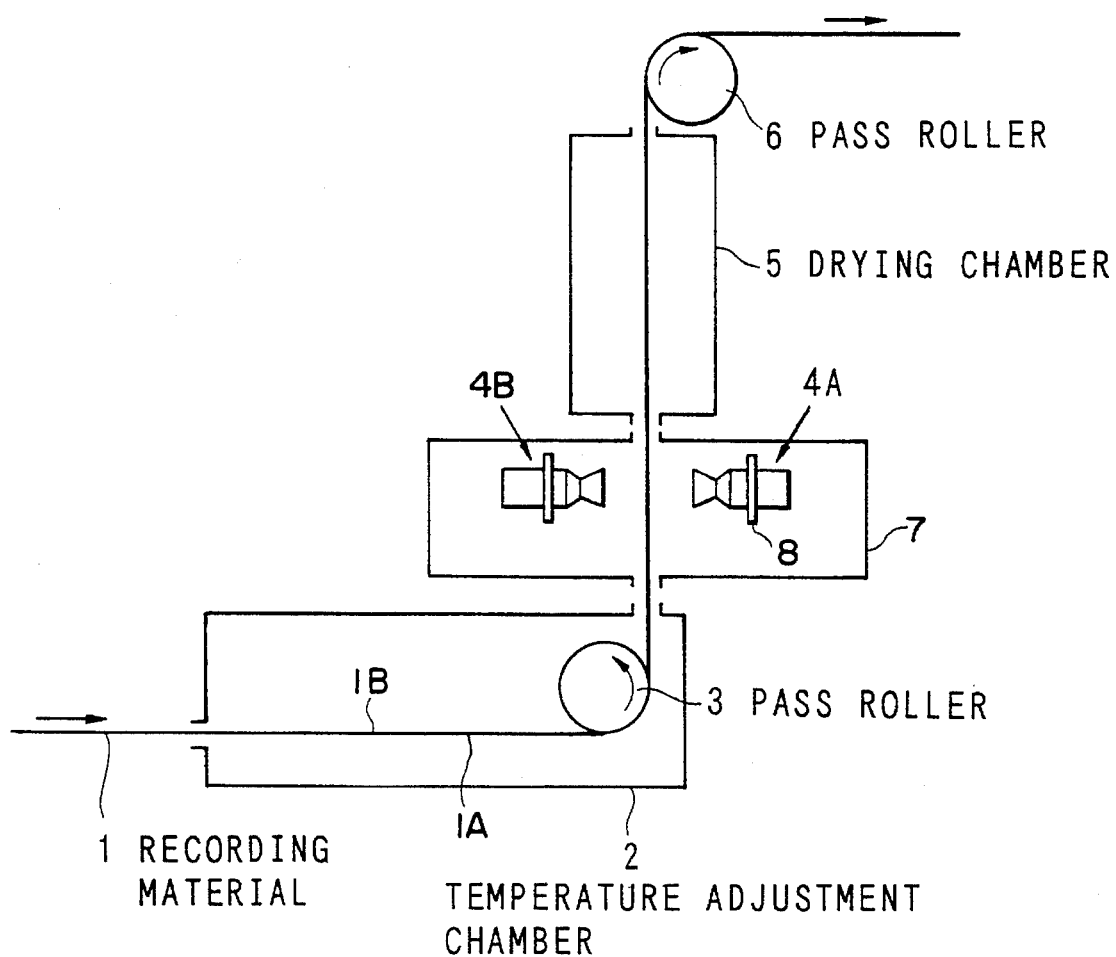
FIG. 1 is a schematic side view showing an example of a process of a method for matting a recording medium according to the present invention.
Figure 2:
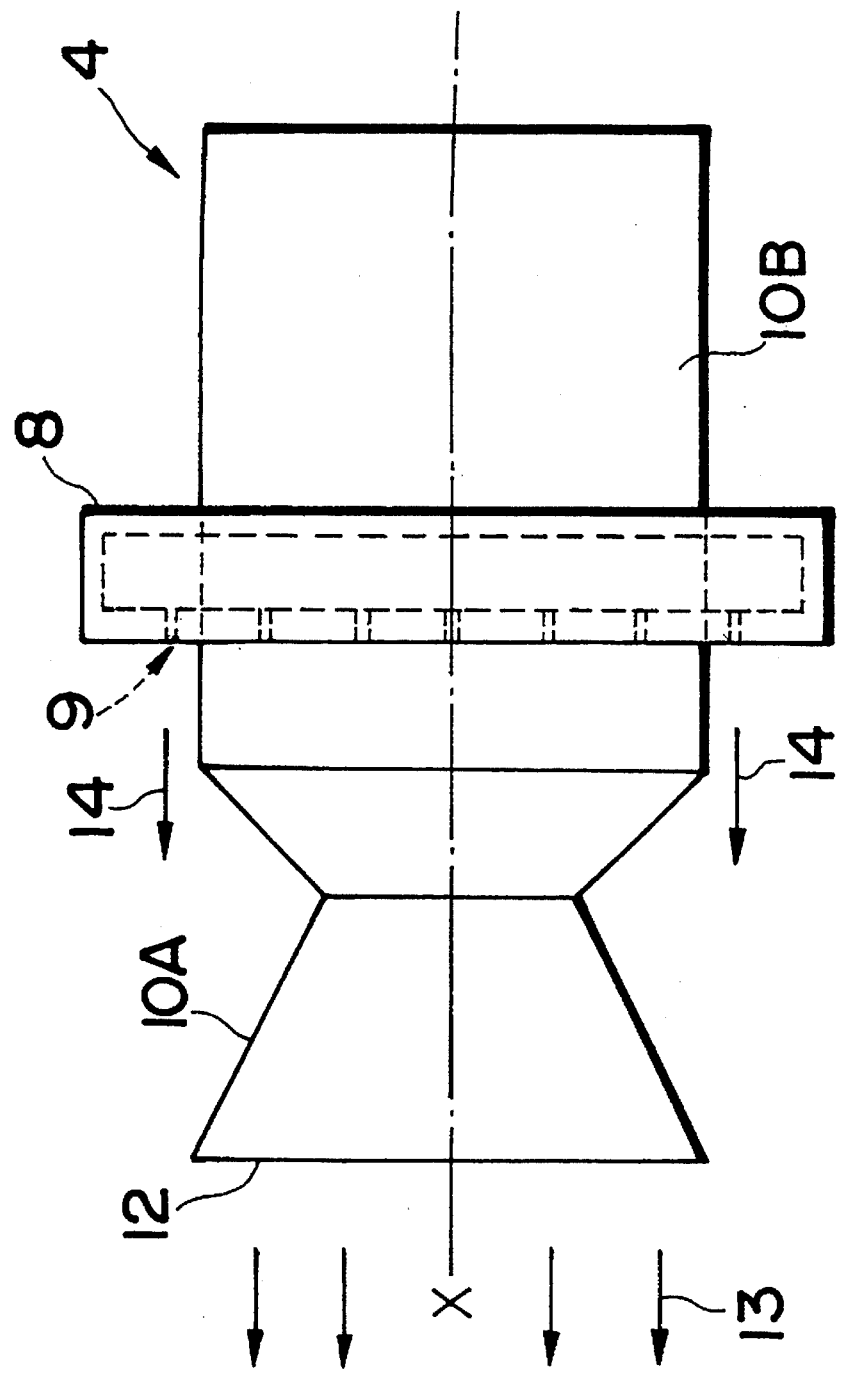
FIG. 2 is a side view showing an embodiment of a rotary atomizing device according to the present invention.
Figure 8:
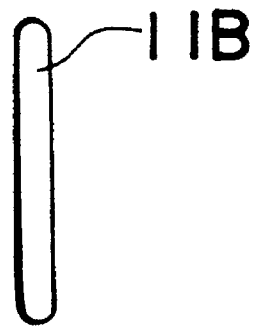
FIG. 8 is an enlarged view showing a gas ejection slit shown in FIG. 7.

FIG. 2 shows an embodiment of a rotary atomizing device according to the present invention. FIGS. 3 to 7 show a ring-shaped gas ejection section as viewed from an opening end 12 of a rotary atomizing unit, and FIG. 8 shows a gas ejection slit of FIG. 7 drawn to an enlarged scale.

The atomizing device 4, which is substantially cylindrical, includes a rotary bell 10A, which is a rotary body as a rotary atomizing unit, a cylindrical driving unit 10B, connected to a lesser diameter portion of the rotary bell 10A for causing it to be rotated, and a ring-shaped gas ejection unit 8, tightly fitted with the inner peripheral surface of a central aperture H thereof on the cylindrical outer peripheral surface of the driving unit 10B. It is unnecessary for the driving unit 10B itself to be rotated, although it has a rotary shaft for causing rotation of the rotary bell 10A.

The rotary bell is rotated about its rotary axis X, as the center of rotation, to cause an atomized stream 13 to be ejected via the opening end 12 in the opening direction.

A gas ejection unit 8 has a plurality of ejection ports 9 which are opened in the direction of the atomized stream to supply a humidifying gas stream to the outer periphery of the opening end 12 parallel to the rotary axis of the rotary atomizing unit. The gas ejection ports 9 are arranged on an annulus along a circumference of a circle having the rotary axis X as the center. For instance, the gas ejection ports may be arranged along a broken-lined annulus on the above-mentioned circle, as shown for example in FIG. 3. The gas ejection ports may also be provided along circumferences of a plurality of concentric circles having the rotary axis X as a common center so as to lie on a plurality of radial lines drawn from the common center, as shown in FIG. 4. Finally, the gas ejection ports may also be provided along broken-lined annuli on the circumferences of a plurality of concentric circles having the rotary axis as a common center so as not to lie on the above-mentioned radial lines, as shown in FIG. 5.

The diameters of the gas ejection ports are preferably 0.1 to 3 mm and more preferably 0.3 to 1.0 mm. It is not mandatory that the ports in their entirety be of the same diameter.

The gas ejection ports may be in the form of one or more slits. Thus the gas ejection ports may be in the form of a continuous circumferential ring-shaped slit 11A having the rotary shaft of the rotary atomizing unit as its center, as shown in FIG. 6. Two or more such ring-shaped slits 11A may be provided on a cocentric circle. The slit width is preferably 0.1 to 2 mm. Although the slit-to-slit distance in the case of providing two or more cocentrically disposed slits is arbitrary, it is preferably 3 to 10 mm. It is unnecessary to have a constant slit clearance.

The gas ejection ports may also be provided as rectangular slits 11B so that their longitudinal directions are in radial or substantially radial directions emanating from the rotary shaft. The rectangular slits preferably have a clearance of 0.1 to 2 mm and a length of 2 to 20 mm.

The gas ejected via the gas ejection ports may be air. However, if the fine droplets contain a large quantity of a solvent, the gas may also be a nitrogen gas.

The velocity at which the gas is ejected via the gas ejection ports may be suitably set depending on the shape or structure of the rotary atomizing unit and the distance of the unit from a recording medium and preferably set in a range of from 3 to 30 m/sec. If the velocity exceeds 30 m/sec, the fine droplets impinge on the recording material at an excessive velocity so that the matting agent becomes planar in shape. On the other hand, if the velocity is less than 3 m/sec, no definite effect tends to be produced.

A typical matting method according to the present invention is explained by referring to FIG. 1.

An elongated recording material 1, caused to travel by being guided by pass rollers 3 and 6, has its temperature adjusted in a temperature adjustment chamber 2, and is subsequently supplied to a spray booth 7, where fine droplets of an aqueous solution containing a matting agent are deposited on an obverse surface 1A and a reverse surface 1B of the recording material by atomizing devices 4A and 4B. These atomizing devices are similar to that shown in FIG. 2, and are each provided with a gas ejection unit 8 having gas ejection ports 9 for ejecting the above-mentioned humidifying gas stream. The humidifying gas stream is supplied on the outer periphery of the atomized stream in the direction of the atomized stream. The recording material is subsequently dried in a drying chamber 5. After drying, desirable micro-projections of the matting agent are strongly affixed on the obverse and reverse surfaces of the recording material. Since the fine droplets are not scattered-away, the spray booth is not contaminated.

Basically, the recording material of the present invention has a recording layer formed on a support. There are a variety of recording layers according to the objective and application of the recording material, such as a photosensitive layer, magnetic recording layer, etc. The recording material having the photosensitive layer may be exemplified by a general photographic photosensitive material, photosensitive material for microphotographs, photosensitive material for radiographs, photographic photosensitive material for printing, those for scientific photography, photographic printing papers, heat developable material or the like. Examples thereof include a laser recording material sensitive to a laser beam, a magnetic recording tape provided with a magnetic recording layer, a magnetic recording film and the like. Since the basic technical concept of the present invention is to provide fine mats on the surface of an object, there is no particular limitation to the type of the recording material, although the recording material is specified herein as an example of the useful object. In other words, the fine mats may be provided on any material, the most useful object to which the present invention is applied is the recording material, so that the object of the present invention is limited to the recording material for precisely defining the invention.

A support for the recording material of the present invention has a dimensionally stable surface and is preferably sheet or plate in the case of a photosensitive material, and tape or sheet in the case of a recording material, for ease of handling. The supports may be of any desired form depending on the equipment on which the recording material is used, or on practical utilization of the recording material. The material for the supports may be paper, such as laminate paper coated with thermoplastic composition, e.g., polyethylene, polypropylene or polystyrene, metal web such as plates of aluminum, various aluminum alloys, zinc, iron or copper, plastic films such as films of cellulose diacetate, cellulose acetate, cellulose acetate butyrate, cellulose propionate, cellulose triacetate, cellulose nitrate, polyethylene terephthalate, polypropylene, polycarbonate or polyvinyl acetal, paper or plastic films coated with the aforementioned metals by lamination or vapor deposition. The material of the supports is suitably selected depending on the objective and application of the recording material. There are a wide variety of known recording layers of the recording material, for instance, as photosensitive layers for the photographic photosensitive material, such as a silver halide-gelatine emulsifier photosensitive material, diazo resin photosensitive layer, photosensitive layer of photosensitive resins, and are employed as a photosensitive layer for the photographic photosensitive material according to the present invention. The above-mentioned photosensitive layers may similarly be used for laser recording materials or magnetic recording materials. It is felt to be unnecessary to provide detailed description as to the other structional features, materials, manufacture, processing, recording processes or application of these recording materials, because any conventional known techniques may be suitably utilized for these purposes.

The present invention resides in the method of matting the obverse and/or reverse surfaces of the recording material consisting fine droplets of a coating solution containing a resin dissolved or dispersed therein on a desired surface, giving electrical charges to the droplets, depositing the fine droplets on the obverse surface and/or reverse surface of the recording material, and subsequently drying the droplets. Such coating solution is desirable that can be deposited under uniform distribution on the obverse or reverse surface of the recording material as droplets of desired size. Thus, in the case of a photographic photosensitive material or laser recording material, the resins of the coating solution may be exemplified as follows. Such resins embrace acrylate-acrylic or methacrylic acid copolymers, styrene-acrylate-acrylic or methacrylic acid copolymers, copolymers of acrylate, styrene or acrylonitrile with acrylic acid, methacrylic acid, maleic acid or itaconic acid; vinyl type polymers, such as polyvinyl alcohol, polyvinyl acetate or polyvinyl pyrrolidone, as described in JP Patent Application No. 55-109984 (JP Patent KOKAI Publication No. 57-34558 (1982)). These resins, as suitably selected, are dissolved or dispersed in water by conventional methods to provide an aqueous solution. The solvents may include organic solvents besides water. The solution may also include other water soluble substance or fillers which do not affect the photosensitive layer or deposited liquid particles, the fillers being such as fine powders of organic materials or polymer powders. As an example, a coating solution may be prepared by emulsifying a starting monomer in water with a surfactant(s) followed by emulsion-polymerizing the resulting emulsion to an aqueous dispersion of the aforementioned copolymers, using a polymerization initiator, such as potassium persulfate, as in the conventional method of synthesizing latices. Part of acrylic acid, methacrylic acid, maleic acid or itaconic acid may be present as sodium, potassium or ammonium salts to provide an aqueous solution of the copolymer.

The resin concentration in the coating solution is preferably 5 to 50 wt %.

The above-mentioned coating solution may be converted into liquid particles of desired size by the process step or device of depositing the liquid particles.

EXAMPLE

Both surfaces of an aluminum sheet, 0.24 mm in thickness, were roughened using a nylon brush and a 400 mesh size pamistone-water suspension, and were washed thoroughly with water. The sheet was immersed for three minutes in a 5% aqueous solution of sodium tertiary phosphate at 70° C. for three minutes, washed with water and dried. 1 part by weight of naphthoquinone-1, 2-diazide-5-sulfonate of polyhydroxy phenyl, produced by condensation polymerization of acetone and pyrogallol, as described in JP Patent KOKOKU Publication No. 43-28403 (1968), and 2 parts by weight of a novolak type phenol formaldehyde resin, were dissolved in a mixture of 20 parts by weight of 2-methoxyethyl acetate and 20 parts by weight of methylethylketone to produce a photosensitive solution. The resulting solution was sequentially applied on both surfaces of the above-mentioned supporting substrate and dried to produce a double-sided type pre-sensitized printing plate which was subsequently cut into three specimens for each of samples A and B, each being of 200×200 mm size.

Figure 3:
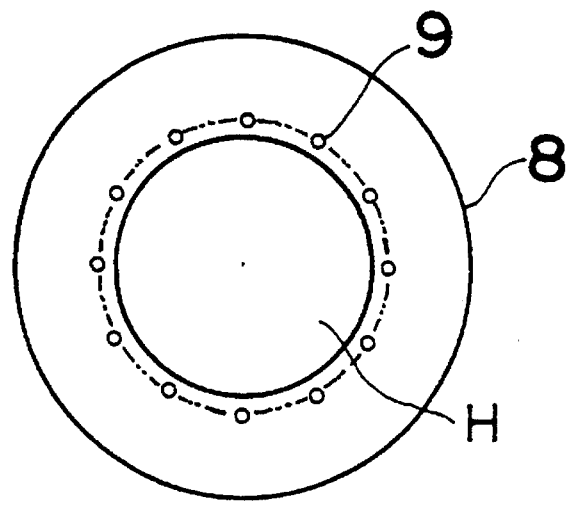
FIG. 3 is a front plan view showing an embodiment of ring-shaped gas ejection ports, as viewed from the opening end of the rotary atomizing unit.
Figure 4:
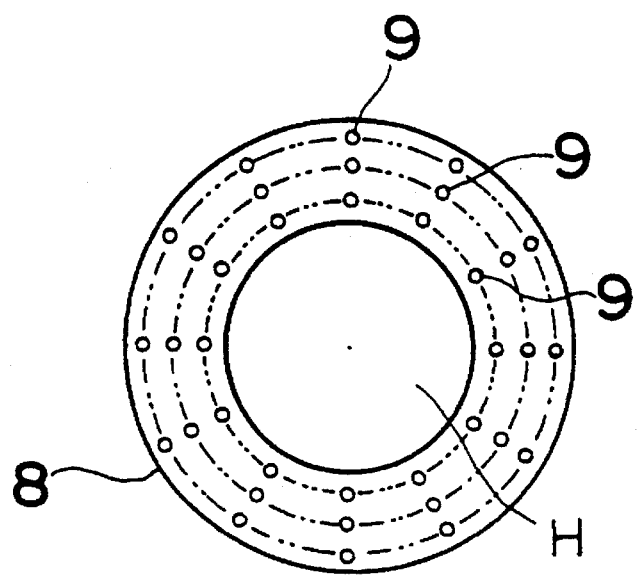
FIG. 4 is a front plan view showing a modification of ring-shaped gas ejection ports, as viewed from the opening end of the rotary atomizing unit.
Figure 5:
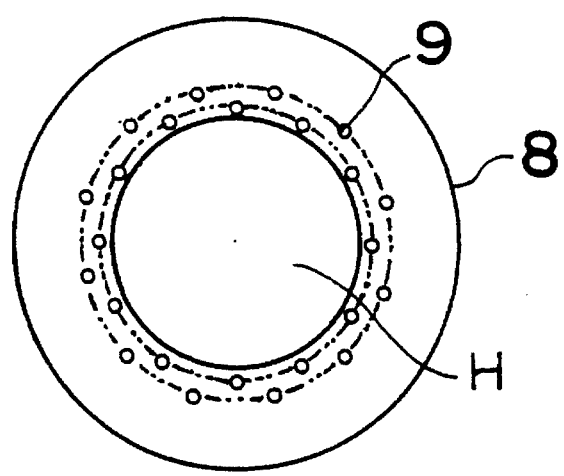
FIG. 5 is a front plan view showing another modification of ring-shaped gas ejection ports, as viewed from the opening end of the rotary atomizing unit.
Figure 6:
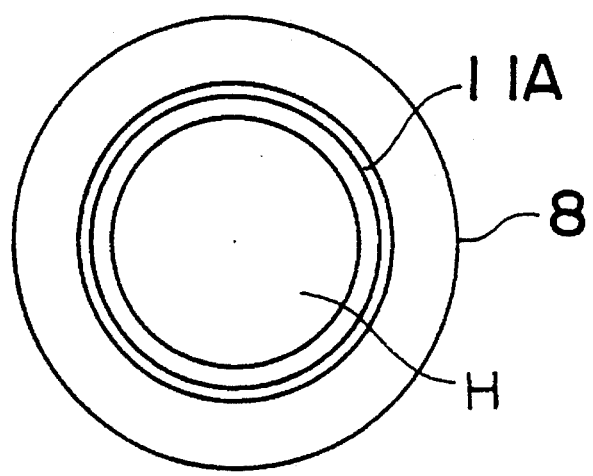
FIG. 6 is a front plan view showing still another modification of ring-shaped gas ejection ports, as viewed from the opening end of the rotary atomizing unit.
Figure 7:
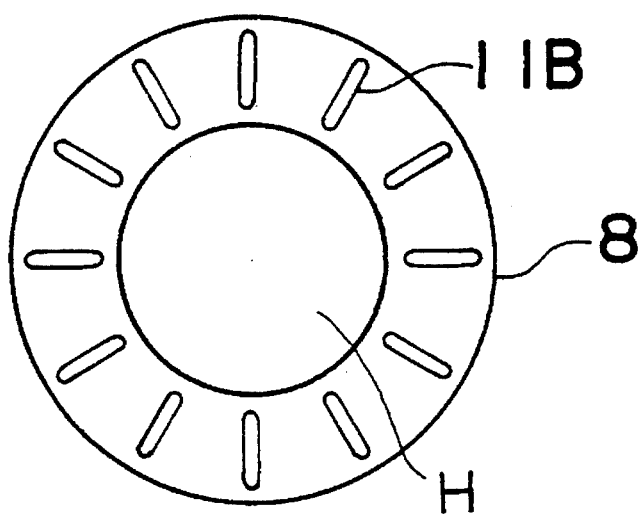
FIG. 7 is a front plan view showing a further modification of ring-shaped gas ejection ports, as viewed from the opening end of the rotary atomizing unit.

For matting the surfaces of these samples, an aqueous solution of methyl methacrylate/ethyl acrylate/sodium acrylate copolymer (weight ratio; 68:20:12 in terms of a ratio of charged amounts) was applied to both surfaces of the samples, at a solid content concentration of 10%, using a rotary atomizing device as shown in FIG. 2. A humidifying gas stream was ejected at this time for the sample A via gas ejection ports. A port size of 0.5 mm in diameter, as shown in FIG. 3, was used, with an ejection rate of 10 m/sec, while maintaining a distance between a rotary bell and the sample at 500 mm. As for the sample B, the operation was carried out in the same way as with the sample A except that no gas stream was ejected from the gas ejection ports.

The gas ejected was air maintained at a temperature of 25° C. and a relative humidity of 55%.

The time since application to the samples A and B until drying thereof was approximately two seconds. Drying was carried out by passing the samples A and B through an atmosphere maintained at a temperature of 60° C. and a humidity of 10%. The coating amount of the mats on the dried sample A was 0.02 g/m$^2$. The mats were distributed at a rate of approximately 20 protrusions per mm$^2$ and were of a height of approximately 8 to 12 μm, with a mat particle size of approximately 30 to 70 μm. No spherical-shaped particles were deposited.

On the other hand, the sample B was applied in an amount of 0.018 g/m$^2$ at a distribution of rate approximately 18 protrusions per mm$^2$. Number of deposited mat protrusions were observed to be spherical-shaped particles with a mat size ranging between 20 and 50 μm.

It should be noted that modifications obvious in the art may be done without departing from the gist and scope of the present invention as disclosed herein and claimed hereinbelow as appended.

What is claimed is:

1. A method for matting a recording material, said method comprising:
   (i) affixing to the recording material fine droplets of an aqueous solution comprising a matting agent in the form of convex-shaped projections by generating said droplets with a rotary atomizing unit and transporting said droplets to the recording material in the form of an atomized stream of fine droplets surrounded on its outer periphery by a humidifying annular gas stream having a humidity of 35 to 70 percent, said annular gas stream being ejected at a speed of 3 to 30 m/sec in the direction of the atomized stream and substantially parallel to the axis of the atomized stream and in a manner effective to maintain the velocity and moisture content of the atomized stream of fine droplets at a level sufficient to form convex-shaped droplets affixed to the recording material when the droplets impinge on the recording material; and
   (ii) drying the affixed fine droplets to form micro-projections of matting agent affixed to the recording material.

2. The method as defined in claim 1, wherein said humidifying gas stream is ejected from a port or ports disposed upstream of an opening end from which said atomized stream is ejected.

3. The method as defined in claim 2, wherein said port or ports comprise at least one annular slit.

4. The method as defined in claim 2, wherein said ports comprise a plurality of ports disposed along at least one annulus centered at an axis of said atomized stream.

5. The method as defined in claim 4, wherein said ports are disposed along annuli cocentering at said axis of the atomized stream.

6. The method as defined in claim 4, wherein said ports comprise a plurality of radially extending slits.

* * * * *